United States Patent [19]

Suzuki

[11] Patent Number: 5,444,294

[45] Date of Patent: Aug. 22, 1995

[54] SEMICONDUCTOR DEVICE OF VERTICAL SURFACE-MOUNTING TYPE

[75] Inventor: Yasuhiro Suzuki, Tokyo, Japan

[73] Assignee: NEC Corporation, Tokyo, Japan

[21] Appl. No.: 253,070

[22] Filed: Jun. 2, 1994

[30] Foreign Application Priority Data

Jun. 4, 1993 [JP] Japan .................. 5-133760

[51] Int. Cl.⁶ ........................................... H01L 25/04
[52] U.S. Cl. .................... 257/666; 257/675; 257/692; 257/796
[58] Field of Search .............. 257/666, 692, 696, 678, 257/796, 675, 676

[56] References Cited

U.S. PATENT DOCUMENTS

| | | | |
|---|---|---|---|
| 4,967,262 | 10/1990 | Farnsworth | 257/696 |
| 5,227,662 | 7/1993 | Ohno et al. | 257/676 |
| 5,260,601 | 11/1993 | Baudonin et al. | 257/696 |
| 5,350,943 | 9/1994 | Angerstein et al. | 257/676 |

Primary Examiner—William Mintel
Assistant Examiner—Roy Potter
Attorney, Agent, or Firm—Young & Thompson

[57] ABSTRACT

A semiconductor device includes a heat radiator having thereon a semiconductor die and an insulating tape. The semiconductor die has pads thereon. Support leads are integral with and support the heat radiator. Inner leads are secured to the heat radiator with the insulating tape intervening therebetween. Outer leads are integral with the inner leads. Bonding wires connect the inner leads to the pads on the semiconductor die. A resin sealer seals the semiconductor die, the heat radiator, the inner leads and the bonding wires. Heat generated in the semiconductor die is dissipated not only from the heat radiator, but also through the support leads 5 and inner leads 3A integral with the heat radiator.

5 Claims, 4 Drawing Sheets

FIG. 1A
PRIOR ART
FIG. 1B
PRIOR ART
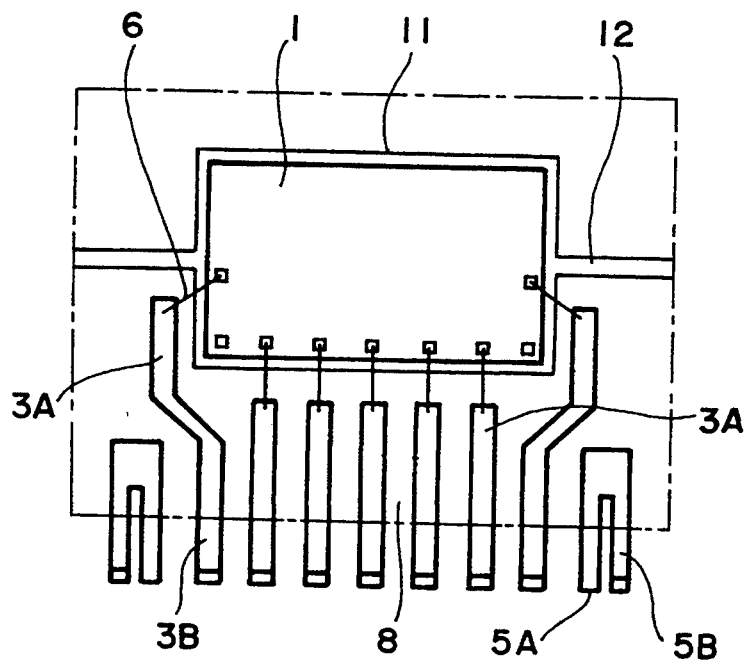
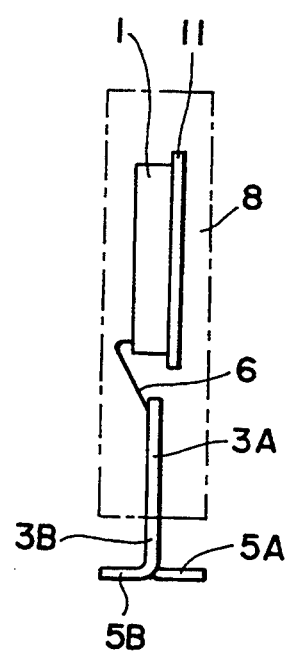
FIG. 1C
PRIOR ART
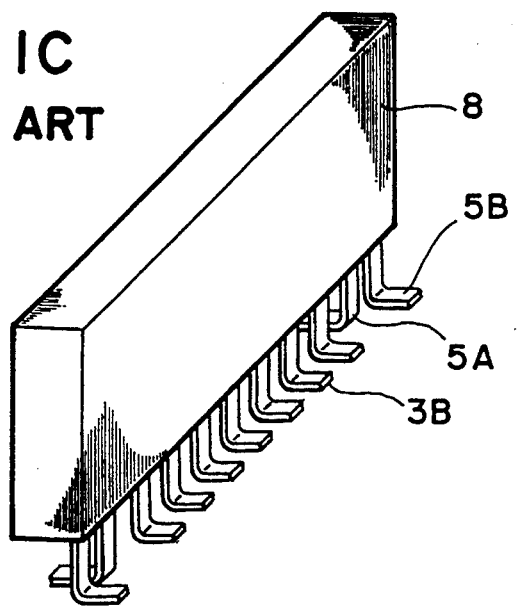

SEMICONDUCTOR DEVICE OF VERTICAL SURFACE-MOUNTING TYPE

BACKGROUND OF THE INVENTION (1) Field of the Invention

The present invention relates to a semiconductor device, and more particularly to a semiconductor device of the vertical surface-mounting type.

(2) Description of the Related Art

Prior art semiconductor devices of vertical surface-mounting type have been developed for enhancing the mounting density per unit area of a printed circuit board when mounting a large number of parts in cases where they are not subject to particular restriction on the height of mounting on the printed circuit board. In this type of semiconductor device, surface-mounting is done with the printed circuit board held upright, and to this end the device has support leads for supporting it.

FIGS. 1A, 1B and 1C show a typical prior art semiconductor device of the type described above. As shown therein, the device comprises a die pad 11 for mounting a semiconductor die 1 thereon, hanging leads 12 for supporting the die pad 11, inner leads 3A integral with outer leads 3B, bonding wires 6 for electrically connecting the inner leads 3A and pads 4 of the semiconductor die 1, support leads 5A and 5B for supporting the body of the semiconductor device in an upright position on a printed circuit board, and a molded resin 8 for sealing these parts therein.

The outer leads 3B project in a row from the molded resin sealer 8. Each of the outer leads 3B has an end which is bent in an L-shaped form in one direction. The support leads 5A and 5B which support the body of the semiconductor device are provided in two pairs each disposed adjacent each end of the row of the outer leads 3B. In the same way as the outer leads 3B, the support leads 5A and 5B in each pair have their respective ends L-shaped in opposite directions. The support leads 5A and 5B are provided for the sole purpose of supporting the semiconductor device so that they are dummy leads not electrically connected to the semiconductor die 1. They are secured by soldering to the printed circuit board in the same as are the outer leads 3B.

In the above prior art semiconductor device of the vertical surface-mounting type, heat generated due to power consumption by the semiconductor die can escape from the die pad 11 or the semiconductor die surface only through the molded resin 8 to the outside. Thus, the obtainable heat resistance of the semiconductor device is only 70°~80° C./W. Therefore, when the power consumption of the semiconductor die exceeds 0.8 W, heat can no longer sufficiently escape to the outside. It is possible to somewhat reduce the heat resistance of the semiconductor device by increasing the size of the die pad. However, since the inner leads 3A and the die pad 11 are made from the same lead frame, the size of the die pad 11 is restricted by the length of the inner leads 3A, and therefore it is difficult to increase the size of the die pad.

In a further respect, while the support leads 5A and 5B which support the semiconductor device in the vertical form are dummy leads that are not utilized electrically, it is nevertheless necessary, in the semiconductor device of the vertical surface-mounting type, to provide areas for these support leads. This imposes restrictions on the number and dimensions, i.e., size, of the outer leads 3B for signals, which is undesirable when seeking to increase the number of pins of the semiconductor device.

SUMMARY OF THE INVENTION

An object of the invention, therefore, is to provide a semiconductor device which overcomes the problems existing in the prior art and to provide an improved semiconductor device of vertical surface-mounting type which permits effective dissipation of heat generated in a semiconductor die to the outside.

According to one aspect of the invention, there is provided a semiconductor device of vertical surface-mounting type, comprising:

a semiconductor die having pads thereon;

a heat radiator to which the semiconductor die is secured;

a pair of support leads integral with and supporting the heat radiator;

an insulating tape provided on the heat radiator at a side of the pair of support leads;

inner leads secured to the heat radiator with the insulating tape intervening therebetween;

outer leads integral with the inner leads;

bonding wires respectively connecting the inner leads to the pads on the semiconductor die; and a molded resin for sealing the semiconductor die, the heat radiator, the inner leads and the bonding wires with the outer leads and parts of the pair of support leads extending in a row form from the resin sealer.

According to the invention, the heat radiator which also serves as a die pad and the support leads are integrally made while the inner leads are bonded to the heat radiator via the insulating tape. Thus, heat generated as a result of the power consumption in the semiconductor die can effectively dissipate from the heat radiator through the molded resin to the outside, and in addition it can also dissipate through the inner leads bonded to the heat radiator and also through the support leads integral therewith to the outside.

Further, with the Ag plating areas provided on the heat radiator and electrically connected to the power source for the semiconductor die or to a grounding pad, the support leads may be used as common lead for power source connection or for grounding. It is thus possible to permit improvement of the electrical properties of the semiconductor device.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 1A, 1B and 1C are respectively a plan view, a side view and a perspective view of a conventional semiconductor device of vertical surface-mounting type;

PREFERRED EMBODIMENTS OF THE INVENTION

Figure 2A:
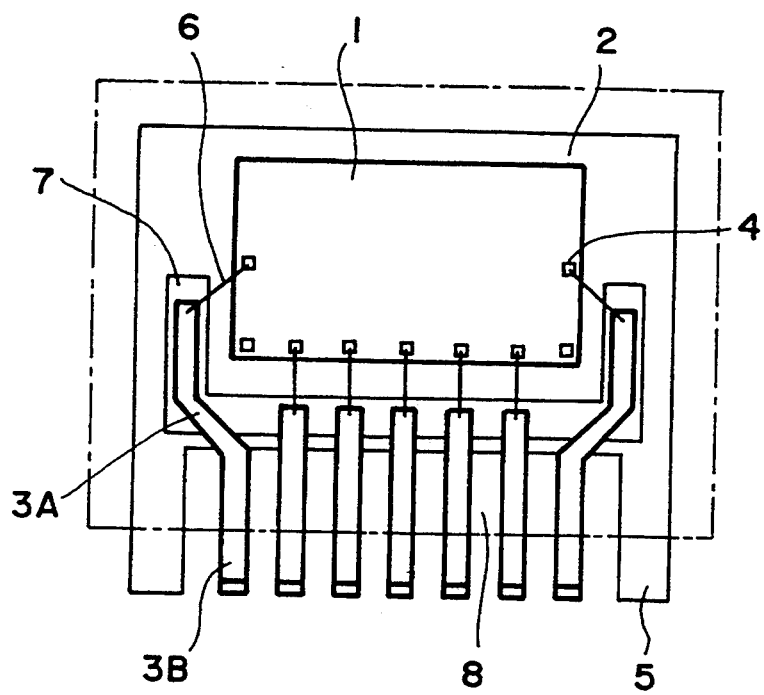
FIGS. 2A, 2B and 2C are respectively a plan view, a side view and a perspective view of a semiconductor device of vertical surface-mounting type of a first embodiment according to the invention.

Now, preferred embodiments of the invention are described with reference to the accompanying drawings. In the following description, the same reference numerals or symbols are used for the same or like elements in all the figures of the drawings.

Figure 2B:
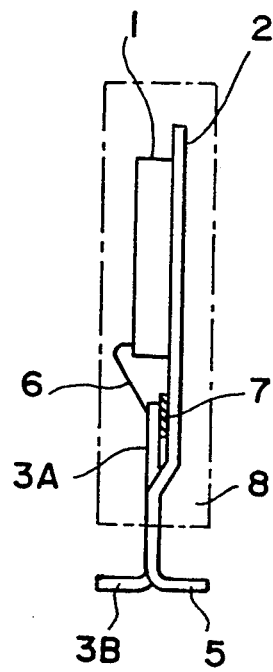
Figure 2C:
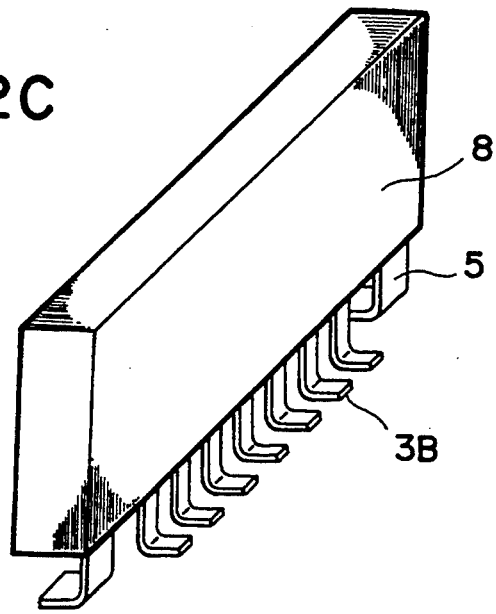

FIGS. 2A, 2B and 2C are respectively a plan view, a side view and a perspective view showing a semiconductor device of a first embodiment according to the invention, the plan and side views showing the molded resin with phantom lines.

Referring to FIGS. 2A through 2C, the illustrated semiconductor device mainly comprises a heat radiator 2 to which a semiconductor die 1 is secured, support leads 5 integral with the heat radiator 2 and supporting the heat radiator 2 when the support leads 5 are mounted on a printed circuit board, the support leads 5 extending in one direction of the heat radiator 2, inner leads 3A secured by insulating tape 7 having an adhesive property to an end of the heat radiator 2 on the side of the support leads 5, the inner leads 3A being integral With outer leads 3B, bonding wires 6 of gold (Au) or the like connecting the inner leads 3A and pads 4 of the semiconductor die 1, and a molded resin 8 for sealing the semiconductor die 1, the heat radiator 2, the inner leads 3B and the bonding wires 6 thereon.

Figure 3:
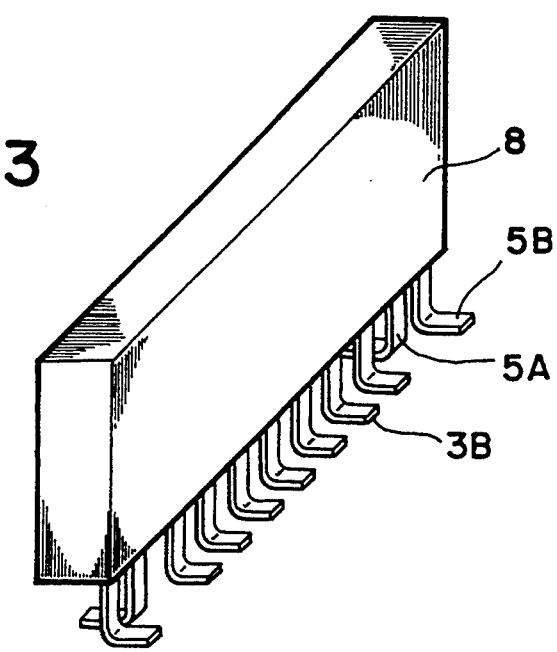
FIG. 3 is a perspective view of a modified semiconductor device of the first embodiment according to the invention.

Each of the outer leads 3B has an end which is bent in an L-shaped form in one direction. Each of the support leads 5 has an end which is bent in an L-shaped form but in an opposite direction to the bent direction of the outer leads 3B. The support leads 5 support the semiconductor device vertically on a printed circuit board. Alternatively, as shown in FIG. 3, the support leads 5 may be in two pairs with the total of four leads as in the prior art example shown in FIGS. 1C.

Figure 4:
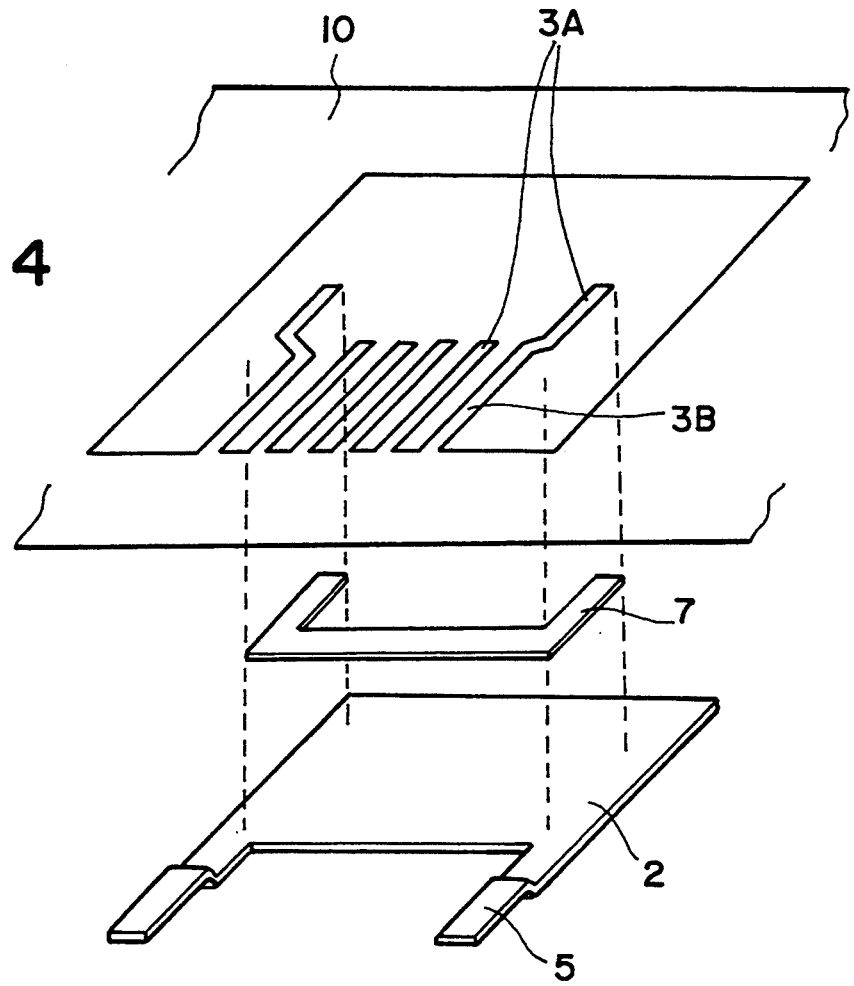
FIG. 4 is a exploded view of relevant elements of a semiconductor device for explaining a part of the fabrication steps for the device according to the invention.

The heat radiator 2 and the inner leads 3A are shown in detail FIG. 4. The heat radiator 2 has support leads 5 which are formed by a bending process whereby a step is formed between the heat radiator 2 and the support leads 5. The inner leads 3A are formed in a lead fame 10. The inner leads 3A are secured to the heat radiator 2 by bonding with a thermal press or the like via an intervening insulating tape 7 having an adhesive property. The process of bending the support leads 5 is carried out for the purpose of having the inner and outer leads 3A and 3B located in the same plane as the support leads 5 after the bonding.

As shown, in the first embodiment, since it is possible to increase the size of the heat radiator 2 which serves as a die pad without any restriction being imposed by the inner leads 3A, the heat generated by the power consumption of the semiconductor die 1 can be effectively diffused or dissipated to outside through the molded resin 8. In addition, the heat radiator 2 is made integral with the support leads 5 and is bonded to the inner leads 3A via the insulating tape 7. It is thus possible to obtain effective heat dissipation through the inner leads 3A, the outer leads 3B extending therefrom and through the support leads 5 to the outside. With these functions, the first embodiment permits heat resistance reduction by about 40% compared to the prior art example, and thus it can cope with a semiconductor die consuming power of about 2 W.

Figure 5:
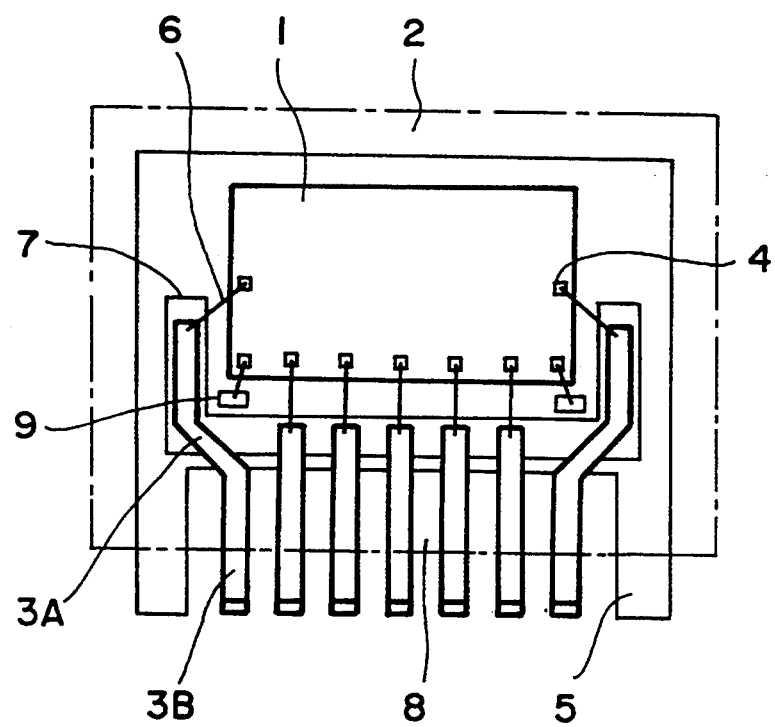
FIG. 5 is a perspective view of a semiconductor device of a second embodiment according to the invention.

FIG. 5 is a plan view showing a second embodiment of the invention. In this second embodiment, the heat radiator 2 is provided with a plurality of Ag plating areas 9 to make the support leads 5 commonly as leads for connection to the power source for the semiconductor die 1 or to a ground potential. The Ag plating areas 9 are connected by bonding wires 6 to pads 4 of the semiconductor die 1. The remainder of the structure is the same as in the first embodiment.

Thus, in the second embodiment, the support leads 5 which have heretofore been a cause of obstructing the pin number increase, may be used for leads for connection of the power source or for grounding. Further, since the heat radiator 2 and the support leads 5 may be made to be common leads for connection of the power source or for grounding, it is possible to improve the electric properties of the semiconductor device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device of vertical surface-mounting type, comprising:
   a semiconductor die having pads thereon;
   a heat radiator to which said semiconductor die is secured;
   a pair of support leads integral with and supporting said heat radiator, said support leads being electrically connected to a lead of one of a power source lead and a ground potential lead;
   and insulating tape provided on said heat radiator at a side of said pair of support leads;
   inner leads secured to said heat radiator with said insulating tape intervening therebetween;
   outer leads integral with said inner leads;
   bonding wires respectively connecting said inner leads to said pads on the semiconductor die; and
   a molded resin for sealing the semiconductor die, said heat radiator, said inner leads and said bonding wires with said outer leads and parts of said pair of support leads extending in a row form from said molded resin.

2. The semiconductor device according to claim 1, wherein said heat radiator is provided with Ag plating areas, said pads on the semiconductor die and said Ag plating areas being connected by bonding wires.

3. The semiconductor device according to claim 1, wherein each of said outer leads has an end which is bent in an L-shaped form in one direction while each of said pair of support leads has an end which is bent in an L-shaped form in a direction opposite to said one direction.

4. The semiconductor device according to claim 1, wherein each of said outer leads has an end which is bent in an L-shaped form in one direction while each of said pair of support leads has a first end which is bent in an L-shaped form in said one direction and has a second end which is bent in an L-shaped form in a direction opposite to said one direction.

5. The semiconductor device according to claim 1, wherein said pair of support leads are integrated to said heat radiator with a step so that said inner and outer leads are positioned in a same plane as said support leads after they are secured to said heat radiator through said insulating tape.

* * * * *